United States Patent [19]

Reimann

[11] Patent Number: 4,663,497

[45] Date of Patent: May 5, 1987

[54] HIGH DENSITY PRINTED WIRING BOARD

[75] Inventor: William G. Reimann, Los Angeles, Calif.

[73] Assignee: Hughes Aircraft Company, Los Angeles, Calif.

[21] Appl. No.: 825,126

[22] Filed: Feb. 3, 1986

Related U.S. Application Data

[60] Division of Ser. No. 636,783, Jul. 31, 1984, Pat. No. 4,591,411, which is a continuation of Ser. No. 374,837, May 5, 1982, abandoned.

[51] Int. Cl.⁴ ............................................. H05K 1/00
[52] U.S. Cl. .................................. 174/68.5; 156/634; 156/656; 156/661.1; 427/97
[58] Field of Search ...................... 174/68.5; 427/53.1, 427/97; 156/634, 656, 661.1, 901, 902

[56] References Cited

U.S. PATENT DOCUMENTS

| | | | |
|---|---|---|---|
| 3,335,489 | 8/1967 | Grant | 174/68.5 |
| 3,391,457 | 7/1968 | Reimann | 174/68.5 |
| 3,464,855 | 9/1969 | Shaheen et al. | 174/68.5 |
| 3,601,523 | 8/1971 | Arndt | 174/68.5 |
| 3,791,858 | 2/1974 | McPherson et al. | 174/68.5 |
| 4,131,516 | 12/1978 | Bakos et al. | 427/97 X |
| 4,383,363 | 5/1983 | Hayakawa et al. | 174/68.5 X |
| 4,541,035 | 9/1985 | Carlson et al. | 174/68.5 X |
| 4,591,411 | 5/1986 | Reimann | 156/634 |

FOREIGN PATENT DOCUMENTS

| | | |
|---|---|---|
| 859934 | 12/1970 | Canada . |
| 981797 | 1/1976 | Canada . |
| 1378154 | 10/1964 | France . |
| 2117172 | 7/1972 | France . |

OTHER PUBLICATIONS

Funari, J., Metallized Multilayer Ceramic Packages with Welded I/O Pins, IBM Technical Disclosure Bulletin, vol. 21, No. 10, p. 3974, Mar. 79.
Baffaro L., Strippable Transmission Line, IBM Technical Disclosure Bulletin, vol. 8, No. 8, Jan. 1966, p. 1056.
Ellis, T. L., Injected Interconnections, IBM Disclosure Bulletin, vol. 11, No. 8, Jan. 1969, p. 992.
Greene, K. F., Producing Printed Circuit Boards, IBM Technical Disclosure Bulletin, vol. 11, No. 12, May 1969, p. 1676.

*Primary Examiner*—Morris H. Nimmo
*Attorney, Agent, or Firm*—Lewis B. Sternfels; Ronald L. Taylor; A. W. Karambelas

[57] ABSTRACT

Feed-through vias (38) of 8 mil and smaller diameter are placed on 25 mil centers or smaller so that the feed-through vias serve only as electrical connections and do not block channels between conductors (24a and 42a). The method for forming such feed-through vias and interconnections utilizes metallic resist (36 and 40) which covers the feed-through vias so that the metallic resist, along with conventional photoresist material, prevent undesired etching of the feed-through vias even in the event of misregistration of the photoresist material.

4 Claims, 15 Drawing Figures

HIGH DENSITY PRINTED WIRING BOARD

This is a division of copending application, Ser. No. 636,783 filed July 31, 1984, now U.S. Pat. No. 4,591,411, in turn a continuation of Ser. No. 374,837 filed May 5, 1982, now abandoned.

BACKGROUND OF THE INVENTION

1. Field of the Invention

The present invention relates to printed wiring boards and, in particular, to layers therefor having increased, high density conductors and feed-through vias.

2. Description of the Prior Art

The number of conductors, which can be successfully positioned on a conventional layer of a multilayer printed wiring board, is limited primarily by the large pads of copper which provide terminations for the conductors. Each pad, and even more so clusters of pads, effectively block channels or locations for the conductors, making it necessary to move the conductors to other less dense layers in the printed wiring board in order to make a connection. The functions of such pads conventionally are electrical and mechanical. The electrical function is to make an electrical connection at the pad, such as to a feed-through or via in the layer, and for this function, it could be much smaller. The purpose of the mechanical function enables the feed-through hole to be completely surrounded in a worst tolerance condition and to prevent etchants from attacking the metal in and adjacent to the hole during board fabrication. Thus, the pad must be made very large, typically 20 mils or more larger than that needed to satisfy its electrical function.

Specifically, the conventional process of forming an etched feedthrough hole or via begins with a blank comprising a core of dielectric material which is doubly cladded with copper. To form the feed-through, holes are drilled through the blank and made conductive with sequential deposits of electroless and electroplated copper. Photoresist material is then formed in a pattern over all exposed metal on the blank except for the surface conductors, lands and holes. Finally, additional copper, followed by tin-lead solder, is electroplated about and into the plated hole and on the conductive material about the plated hole to form a land area. The photoresist is removed and, using the solder as an etch resistant material, the exposed cladding is etched to form conductors on the surfaces of the blank and to form it into a printed wiring board layer. It is obvious, therefore, that the copper and solder plated pad functions both as a means for electrical connection as well as for protection against etching of the copper in the hole. If these plated through holes were vias in an internal layer of a multilayer printed wiring board, the solder plate would be stripped prior to lamination in order to enhance bonding. As an alternate to plating solder around and into the holes, the holes may be tented with photoresist film before the etching operation.

The size of the land area, which is used to protect the copper deposited in and about the feed-through hole during etching, is determined by three major factors. First, there must be sufficient tolerance, typically of 10 mils, to afford a proper registration from one photoresist pattern to another. For example, the holes must be surrounded by exposed copper, even though the resist image will be shifted one way or the other due to fabrication tolerances. Second, there must be a tolerance in the location in the various holes to accomodate any off-center hole and, for this purpose, the holes are made approximately 6–10 mils larger than the hole diameter. Third, the land must be further enlarged to protect the copper in the hole from being etched; the predetermined tolerance therefor being about 4–10 mils beyond the hole diameter. The sum of these tolerances and requirements provide a land area which is 20–30 mils larger than the hole. Since the smallest hole diameter typically is 13.5 mils in diameter, the smallest sized land area is 33.5–43.5 mils, or two and one-half to three times the size of the hole.

As a result of such large land areas, the conductor density is limited, and the spacing between plated through holes is limited to approximately 50 mil centers, a standard in the industry. If it were desired to increase the number of conductors, then more printed wiring board layers would be required to interconnect any given set of component terminations. It is preferable to reduce the number of layers and to increase the density within any given layer.

More recently, hermetic leadless carriers are increasingly being used, with the aim of terminations on 20 to 25 mil centers. Such decreased spacing creates a requirement for even higher density of printed wiring board layers than is achievable using conventional techniques.

SUMMARY OF THE INVENTION

The present invention avoids and overcomes these and other problems by formation of land areas which serve only to provide an electrical connection and which are at least as small as the conductors which they terminate. For example, feed-throughs or vias of 8 mils and less in cross-section are obtainable in printed circuit boards and, therefore, can at least equal the width of the conductors to which they are bonded.

Briefly, to produce such feed-throughs or vias, conductive via material is placed in openings through the dielectric core of the printed wiring board and is extended substantially to the opposed copper clad surface of the printed wiring board at the locations of the feed-through vias, thereby exposing the backside of the opposing copper foil. The exposed backside foil in the openings is coated with conductive resist material, and conductive cladding overlays both the dielectric core and the conductive resist material. While the conductive cladding and conductive via material may be of the same substance, the resist material must be of a composition which is different therefrom. Thus, portions of the conductive cladding may be removed, such as by an etchant, but the conductive resist material protects the conductive via material in the openings from being etched.

Several advantages result therefrom. Since protection of the plated hole during the etching is no longer a consideration, large pads are no longer required. Each via or feed-through has a dimension which is not necessarily larger than that of the conductor to which it is electrically coupled, e.g., 8 mils and smaller. Thus, no conductor channel is blocked by the feed-through and, therefore, the conductor density can be enormously increased. Also the center-to-center spacing between vias can be reduced from conventional 50 mil centers to 25 mil or even 12.5 mil centers. As a result, the number of printed wiring board layers required to interconnect any given set of component terminations is substantially reduced by allowing full utilization of the surface area of the layer. Further, more terminations per unit area are obtainable than allowed by conventional techniques. Because the number of layers is reduced for a given set of interconnections and terminations, the entire weight of the printed wiring board is reduced. For a given printed wiring board thickness or weight, it is further possible to obtain a higher electrical impedance if the number of layers is reduced by increasing the spacing between layers.

Other aims and advantages as well a more complete understanding of the present invention will appear from the following explanation of exemplary embodiments and the accompanying drawings thereof.

BRIEF DESCRIPTION OF THE DRAWINGS

FIGS. 1–12 depict several of the process steps used to form a printed wiring board layer from a sheet of dielectric material having a single conductive cladding, as shown in FIG. 1, or having a double cladding, as shown in FIG. 2a;

DETAILED DESCRIPTION OF THE INVENTION

Figure 1:
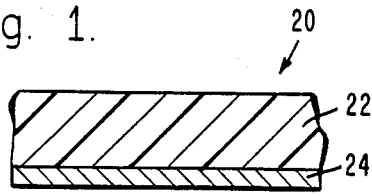

To produce a high conductor density layer for a multilayer printed wiring board, the beginning step may use a sheet or blank of dielectric material having a conductive cladding on one or both sides thereof. FIG. 1 illustrates a blank 20 having a core 22 of dielectric material with a single layer cladding 24 of conductive material thereon. Core 22 may comprise any conventional dielectric such as epoxy glass, polyimide glass, and epoxy-Kevlar or polyimide-Kevlar. Cladding 24 conventionally comprises one ounce copper, that is, approximately 1.4 mils thick. Using conventional methods of chemical etching or laser drilling, a hole or opening 26 of about 5 mil diameter is formed entirely through core 22 from its unclad surface 28 to its clad surface 30 to which cladding 24 is attached. It is to be understood that the diametrical opening size of 5 mils is given only for purposes of example and to illustrate that the feed-through or vias produced can be at least 2.5 time smaller than the smallest conventional via of about 13.5 mils in diameter.

Figure 2:
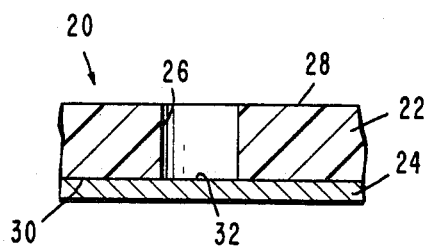
Figure 2A:
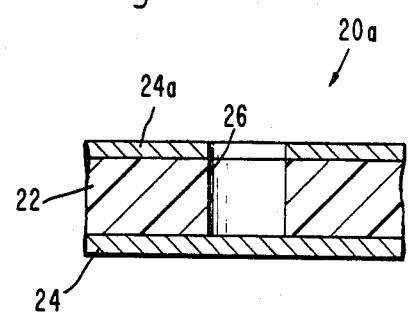

Alternatively, as depicted in FIG. 2a, a doubly clad blank 20a, comprising a dielectric core 22 and a double layer cladding 24 and 24a on both sides thereof, are processed to form an opening 26 therein. The opening is etched or otherwise formed through cladding 24a to provide perforations therethrough, after which a different etchant is used to etch through core 22, perforated cladding 24a acting as a resist therefor. If desired, laser drilling may be used to form hole 26 in core 22, with copper cladding 24a then constituting a reflective mask. Thereafter, cladding 24a is removed, again to form the structure depicted in FIG. 2. At this point, hole 26 has an approximate cross-sectional diameter of 5 mils. Cladding 24 is exposed by hole 26, and its upper layer is designated by indicium 32.

Figure 3:
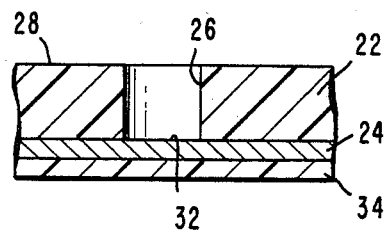
Figure 4:
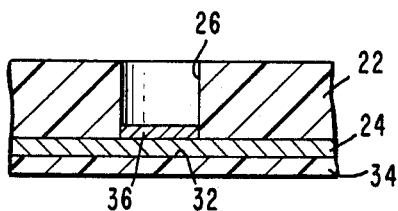

A resist 34 is then placed on the bottom side of cladding 24, as shown in FIG. 3, and exposed portion 32 of cladding 24 is fully coated, e.g., by electroplating, with a metallic resist 36, such as of gold, nickel, and tin-nickel, to a thickness of approximately 0.0001 to 0.0003 inches, as illustrated in FIG. 4. Dielectric 22 and resist 34 prevent plating on other portions of the blank.

Figure 5:
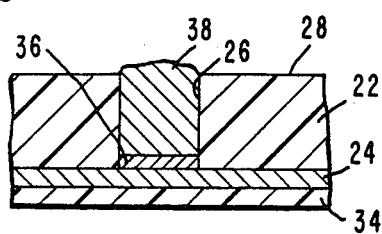
Figure 6:
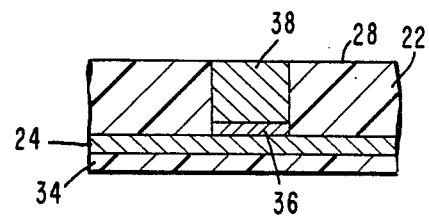

As shown in FIG. 5, hole 26 is then completely filled with a conductive material 38 such as of copper to form a feed-through or via in core 22. Upper surface 28 of core 22 may be sanded to ensure that the copper filling is flush with the top of the hole (e.g., as seen in FIG. 6).

Figure 7:
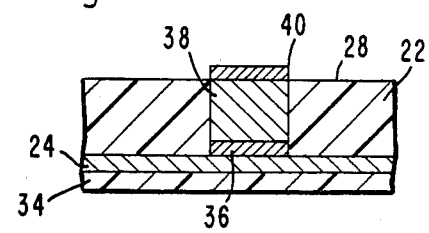

A further metallic resist 40, similar to conductive resist 26 is then electroplated or otherwise deposited on the top surface of copper via 38 at surface 28 of core 22, as viewed in FIG. 7. While both conductive resist materials 36 and 40 are extremely thin, that is from one ten-thousandths to three ten-thousandths of an inch, for purposes of illustration, these resists are drawn much thicker than they actually are.

Figure 8:
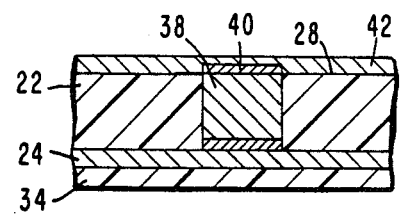
Figure 9:
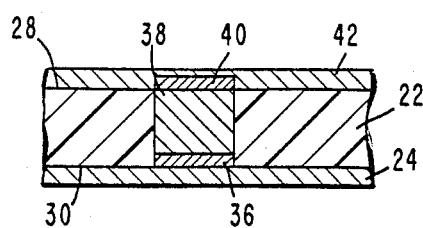

As shown in FIG. 8, the next step involves the placement of a metallic foil 42, for example of copper, on surface 28 of core 22 and over conductive resist 40 by sequential electroless deposition and electroplating processes. Resist 34 is then stripped from cladding 24, to result in the structure of FIG. 9.

Figure 11:
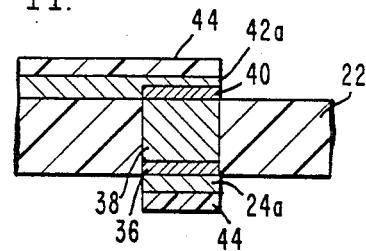
Figure 10:
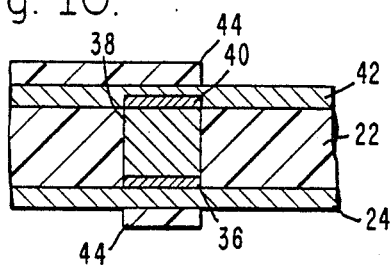

Both claddings 24 and 42 are then coated with a photoresist which is configured in a pattern 44 of the desired interconnections (see FIG. 10). Using an etchant which is capable of removing the material of claddings 24 and 42 but not that of metallic resists 36 and 40 and photoresist 44, claddings 24 and 42 are selectively removed, the result being depicted in FIG. 11.

Photoresist 44, is perfectly placed over claddings 24 and 42 and conductive feed-through material 38, might be sufficient to prevent undesired etching of feed-throughs 38 in the absence of conductive resist material 36 and 40. However, in this case any misregistration would expose feed-throughs or vias 38 to undesired removal of material therefrom, which would prevent a proper electrical or mechanical connection thereto. Therefore, the plating of vias 38 by conductive resist 36 and 40 allows for any errors in registration.

Figure 12:
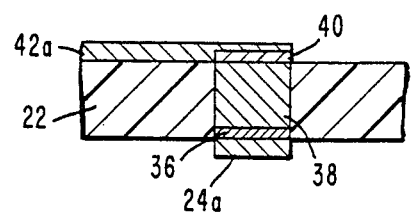

Resist material 44 is then removed to produce the finished printed wiring board layer shown in FIG. 12, in which the interconnections made from the claddings are denoted respectively by indicia 24a and 42a. For ease in preparing interconnections amongst the various feed-throughs or vias, interconnections 24a may be placed orthogonally with respect to interconnections 42a.

Figure 14:
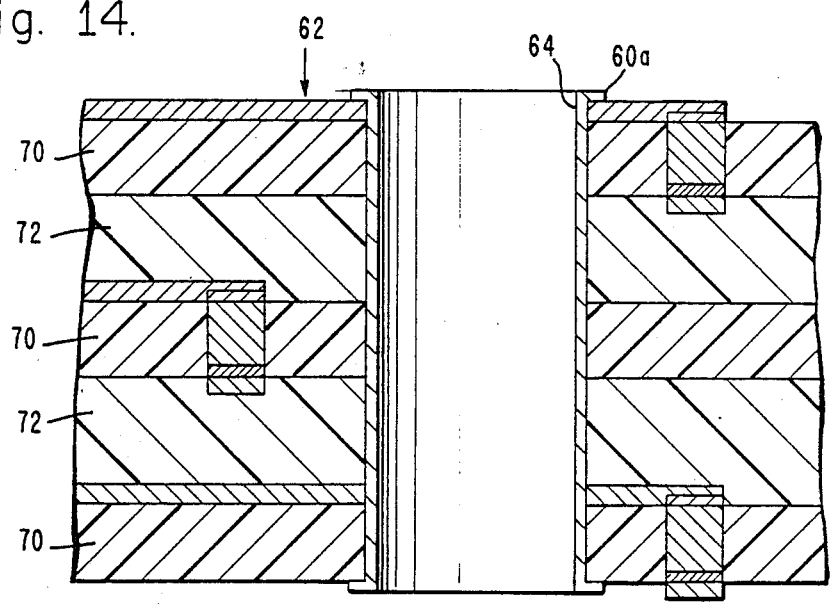
FIG. 14 is a cross-sectional view of a plurality of printed wiring board layers formed according to the teachings of the present invention joined with a conventional plated-through hole using, for example, the layer illustrated in FIG. 13.
Figure 13:
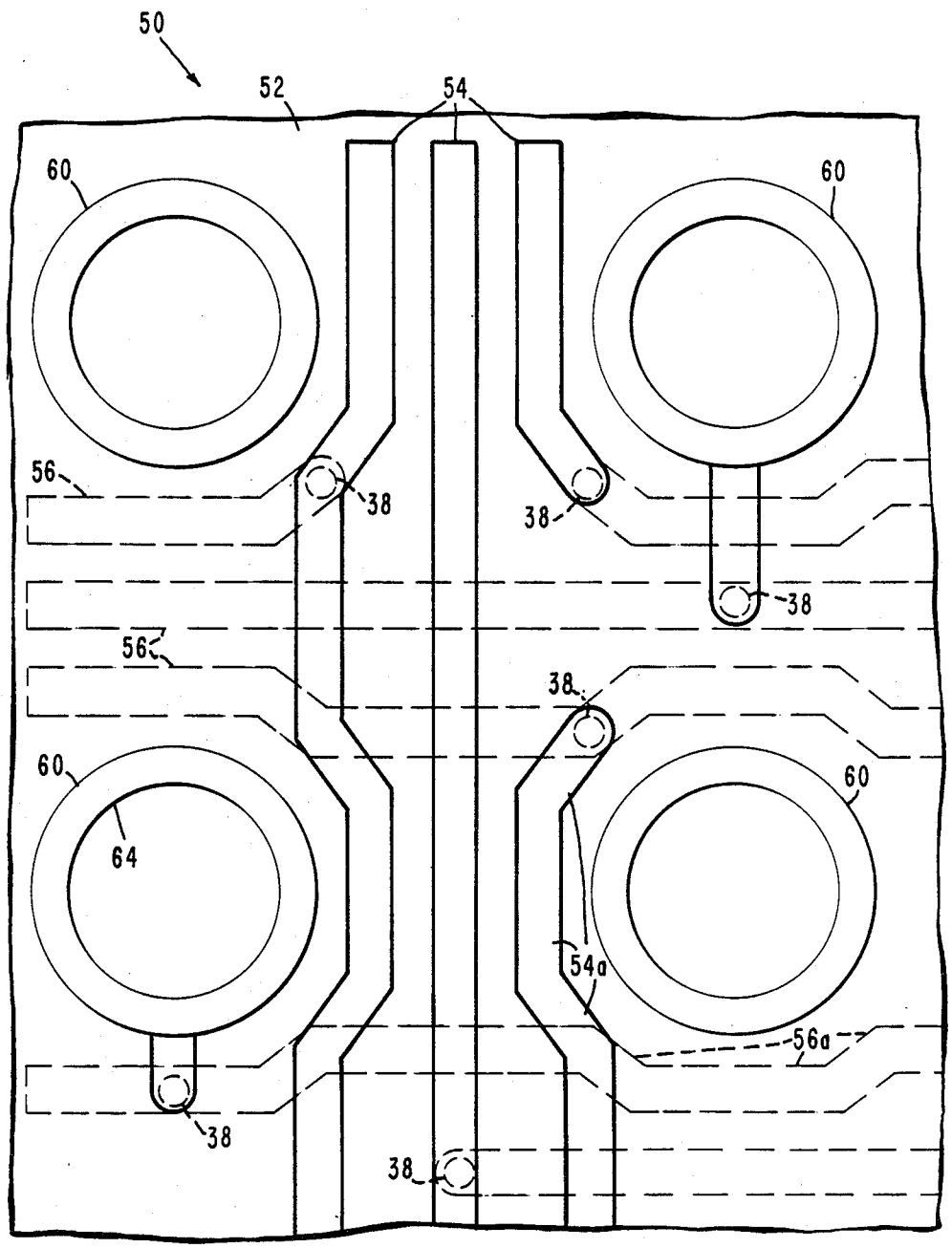
FIG. 13 depicts a layer having small vias, formed according to the present invention, and larger conventional land areas.

Furthermore, it may be desired to combine the feed-through and interconnection conductors formed according to the present invention with the standardized larger land areas of the prior art. Such a modification is illustrated in FIG. 13. A layer 50 comprises a dielectric core 52 having on one side a plurality of interconnection conductor lines 54, which extend generally in parallel, and on the other side another plurality of generally parallel interconnection lines 56 which extend orthogonally with respect to interconnections 54. Lines 54 and 56 are electrically interconnected by a plurality of feed-through vias 38 which are formed according to the teachings of the present invention. In addition, enlarged pads 60, e.g., of greater that 10 mil diameter, are also formed respectively by etching one or both of the claddings from which conductor lines 54 and 56 were produced. To provide space for enlarged land areas 60, conductor lines 54 and 56 which thereby are routed around pads 60 are staggered from straight line configuration as shown, for example, by portions 54a and 56a. Enlarged pads 60 may be used to form feed-through holes in a multilayer printed wiring board 62 as depicted in FIG. 14, which shows illustratively one feed-through hole 64 extending through a plurality of layers 70 joined together by a prepreg material 72 (a pre-impregnated cloth). Each layer 70 may have a configuration similar to that of layer 50 of FIG. 13. Feed-through holes 64 of FIG. 14 is enlarged by annularly configured pads 60a.

Although the invention has been described with reference to particular embodiments thereof, it should be realized that various changes and modifications may be made therein without departing from the spirit and scope of the invention.

What is claimed is:

1. A printed wiring board comprising a support of dielectric material having opposed first and second sides, solid feed-through vias of conductive material extending between said sides and having first and second surfaces in which said first surface is flush with said first side and said second surface is spaced inwardly from said second side, and first and second conductive material respectively coating said first and second surfaces of said feed-through vias at said sides, said first conductive material extending slightly above said first side and said second conductive material being flush with said second side, said first and second conductive materials having a composition which is different from that of said feed-through vias.

2. A printed wiring board according to claim 1 in which said feed-through vias have a maximum cross-sectional dimension of 8 mils.

3. A printed wiring board according to claim 1 in which said feed-through vias are placed on maximum centers of 25 mils.

4. A printed wiring board according to claim 1 further comprising conductors interconnecting said feed-through vias, said vias being dimensioned in width smaller than said conductors.

* * * * *